United States Patent
Lin et al.

(10) Patent No.: US 8,145,171 B2
(45) Date of Patent: Mar. 27, 2012

(54) CLOCK CLEAN-UP PHASE-LOCKED LOOP (PLL)

(75) Inventors: I-Hsiang Lin, Mountain View, CA (US); Roger Brockenbrough, Los Gatos, CA (US)

(73) Assignee: Qualcomm Incorporated, San Diego, CA (US)

( * ) Notice: Subject to any disclaimer, the term of this patent is extended or adjusted under 35 U.S.C. 154(b) by 426 days.

(21) Appl. No.: 12/404,200

(22) Filed: Mar. 13, 2009

(65) Prior Publication Data

US 2010/0085090 A1   Apr. 8, 2010

Related U.S. Application Data

(60) Provisional application No. 61/103,893, filed on Oct. 8, 2008.

(51) Int. Cl.
*H03L 7/22* (2006.01)
(52) U.S. Cl. ........................................ 455/260
(58) Field of Classification Search .............. 455/260, 455/296, 302
See application file for complete search history.

(56) References Cited

U.S. PATENT DOCUMENTS

| 5,757,239 A | 5/1998 | Gilmore |
| 7,339,984 B1 | 3/2008 | Daou |
| 2008/0181340 A1 * | 7/2008 | Maxim ............... 375/346 |

FOREIGN PATENT DOCUMENTS

| EP | 0019412 A1 | 11/1980 |
| WO | WO2008021810 | 2/2008 |

OTHER PUBLICATIONS

International Search Report and Written Opinion—PCT/US2009/060062, International Search Authority—European Patent Office—Dec. 21, 2009.

* cited by examiner

*Primary Examiner* — Stephen Jones
(74) *Attorney, Agent, or Firm* — Ramin Mobarhan; Eric Ho

(57) ABSTRACT

A clock clean-up phase-locked loop (PLL) that may reduce spurs and improve performance of a receiver is described. In one exemplary design, an integrated circuit includes a PLL and an analog-to-digital converter (ADC). The PLL receives a first clock signal generated with a fractional divider ratio and having spurs due to abrupt frequency jumps. The first clock signal may be generated by a fractional-N frequency synthesizer external to the integrated circuit. The PLL generates a second clock signal with an integer divider ratio and having reduced spurs. The ADC digitizes an analog baseband signal based on the second clock signal and provides digital samples. The integrated circuit may further include a low noise amplifier (LNA), which may observe less spurs coupled via the substrate of the integrated circuit due to the use of the PLL to clean up the first clock signal.

25 Claims, 9 Drawing Sheets

Frequency Spectrum of a Clock Signal from a Factional-N Frequency Synthesizer

Frequency Spectrum of a Clock Signal from an Integer-N PLL

CLOCK CLEAN-UP PHASE-LOCKED LOOP (PLL)

CLAIM OF PRIORITY UNDER 35 U.S.C. §119

The present Application for Patent claims priority to Provisional Application Ser. No. 61/103,893, entitled "IN-BAND SPUR REDUCTION FOR SENSITIVE RECEIVER," filed Oct. 8, 2008, assigned to the assignee hereof, and expressly incorporated herein by reference.

BACKGROUND

I. Field

The present disclosure relates generally to electronics, and more specifically to a circuit to generate a clean clock signal.

II. Background

A wireless device such as a cellular phone typically includes one or more receivers. Each receiver may receive an input radio frequency (RF) signal, process (e.g., amplify, downconvert, and filter) the input RF signal, and provide an analog baseband signal. The receiver(s) may be implemented on an RF integrated circuit (RFIC), which may include other circuits such as one or more analog-to-digital converters (ADCs). An ADC may receive a clock signal from an integrated circuit (IC) external to the RFIC, digitize an analog baseband signal from an associated receiver with the clock signal, and provide digital samples to the external IC. The clock signal may include undesired spurs, which are undesired spectral components. The spurs may degrade the performance of the receiver(s) on the RFIC.

DETAILED DESCRIPTION

The word "exemplary" is used herein to mean "serving as an example, instance, or illustration." Any design described herein as "exemplary" is not necessarily to be construed as preferred or advantageous over other designs.

A clock clean-up PLL that can receive a first clock signal having undesired spurs and provide a second clock signal having less spurs is described herein. The clock clean-up PLL may be used for various electronics devices such as wireless communication devices, cellular phones, personal digital assistants (PDAs), handheld devices, wireless modems, cordless phones, broadcast receivers, Bluetooth devices, etc. For clarity, the use of the clock clean-up PLL in a wireless device, which may be a cellular phone or some other device, is described below.

Figure 1:
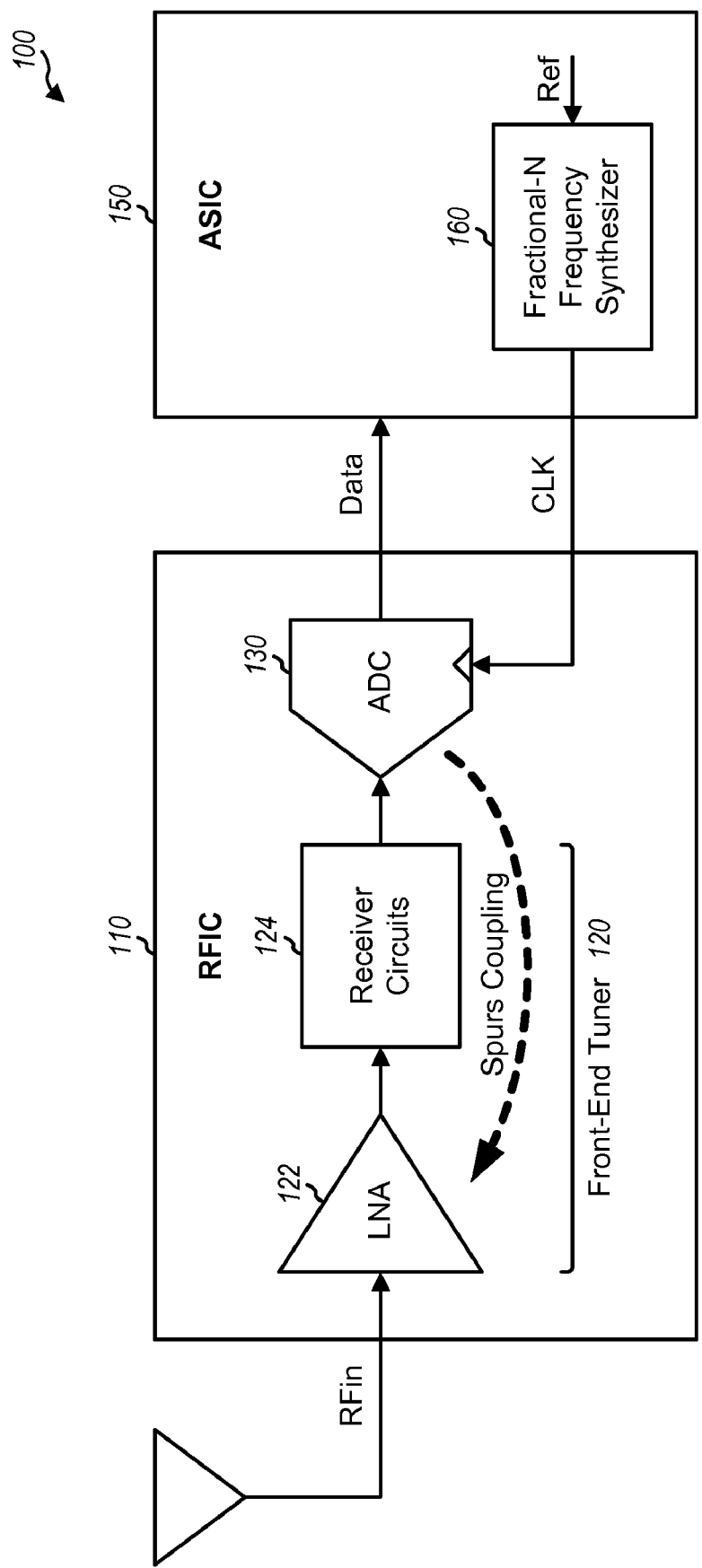
FIG. 1 shows a wireless communication device with coupling of spurs.

FIG. 1 shows a block diagram of an exemplary design of a wireless communication device 100, which includes an RFIC 110 and an application specific integrated circuit (ASIC) 150. In the exemplary design shown in FIG. 1, RFIC 110 includes a front-end tuner 120 and an ADC 130. Front-end tuner 120 includes a low noise amplifier (LNA) 122 and receiver circuits 124. LNA 122 receives an input RF signal (RFin) from an antenna, amplifies the input RF signal, and provides an amplified RF signal. Receiver circuits 124 process (e.g., downconvert, amplify, and filter) the amplified RF signal and provide an analog baseband signal. Receiver circuits 124 may include one or more downconverters, filters, amplifiers, and/or other circuits, which are not shown in FIG. 1 for simplicity. ADC 130 digitizes the analog baseband signal with a clock signal (CLK) from ASIC 150 and provides digital samples to ASIC 150.

ASIC 150 may include various processors, controllers, memories, and other modules (not shown in FIG. 1), which can process the digital samples from ADC 130 and perform other functions for wireless device 100. ASIC 150 also includes a fractional-N frequency synthesizer 160 that can generate the clock signal for ADC 130. In general, a fractional-N frequency synthesizer is a circuit block that receives an input signal at a first frequency and generates an output signal at a second frequency, with the first frequency being related to the second frequency by a non-integer ratio. In the exemplary design shown in FIG. 1, frequency synthesizer 160 receives a reference (Ref) signal having a precise frequency of $f_{in}$ and provides the clock signal having a desired frequency of $f_{out}$. The factional divider ratio N is equal to the ratio of $f_{in}$ to $f_{out}$, or $N=f_{in}/f_{out}$, and is dependent on the desired $f_{out}$ for a given $f_{in}$. The term "factional-N" refers to the fact that the divider ratio N may be a non-integer value.

FIG. 1 shows a simple design with RFIC 110 including a single receiver. In general, RFIC 110 may include any number of receivers for any number of radio technologies and frequency bands. RFIC 110 may also include one or more transmitters.

FIG. 1 shows an example of a system-on-chip (SoC) receiver, which includes front-end tuner 120 and on-chip ADC 130 fabricated on a common substrate. The integration of ADC 130 on chip may be desirable to obtain lower cost, smaller circuit area, higher level of integration, etc. However, ADC 130 can generate noise that may couple via the substrate to other sensitive circuits within the receiver, such as LNA 122. The spectral content of the noise generated by ADC 130 may be dependent on the spectral content of the clock signal used to trigger ADC 130. Thus, it is desirable to use a clean clock signal for ADC 130.

The SoC receiver typically interfaces with a host such as ASIC 150 in FIG. 1. For data synchronization between the host and the SoC receiver, the host may generate the clock signal for on-chip ADC 130, as shown in FIG. 1. The clock signal may contain undesired spurs. This may be the case especially if the clock signal is generated by fractional-N frequency synthesizer 160.

Figure 7A:
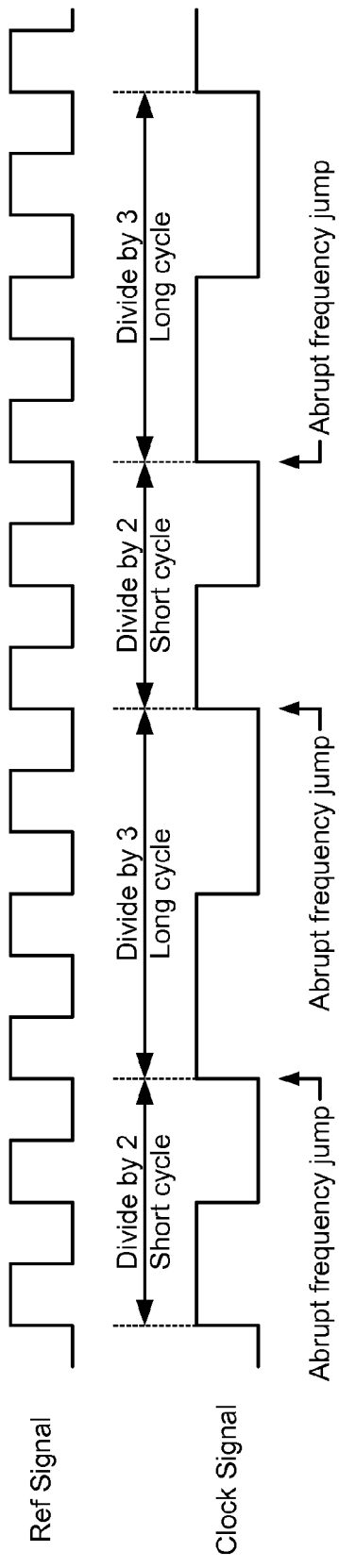
FIGS. 7A and 7B show timing diagrams of a first clock signal from a fractional-N frequency synthesizer and a second clock signal from the integer-N PLL.

FIG. 7A shows an exemplary timing diagram of the clock signal generated by fractional-N frequency synthesizer 160 in FIG. 1. Frequency synthesizer 160 may divide the reference signal in frequency by two integer divider ratios L and M to obtain the clock signal at the desired frequency, where typically M=L+1. The fractional divider ratio N may be a non-integer value between L and M. Frequency synthesizer 160 may then divide the reference signal in frequency by L some of the time and by M some other time using an accumulating counter. The clock signal may include "short" cycles mixed with "long" cycles, with each short cycle covering L periods of the reference signal and each long cycle covering M periods of the reference signal. The percentage of short cycles and the percentage of long cycles are dependent on the fractional divider ratio N as well as the integer divider ratios L and M. The locations of the short and long cycles are dependent on how the divider ratios L and M are selected. In any case, an abrupt jump in the frequency of the clock signal occurs whenever the divider ratio changes from L to M (i.e., a switch from short cycle to long cycle occurs) and also from M to L (i.e., a switch from long cycle to short cycle occurs). In the example shown in FIG. 7A, L=2, M=3, and N=2.5. The clock signal thus includes alternating short cycles and long cycles, with each short cycle covering two periods of the reference signal and each long cycle covering three periods of the reference signal.

Figure 8A:
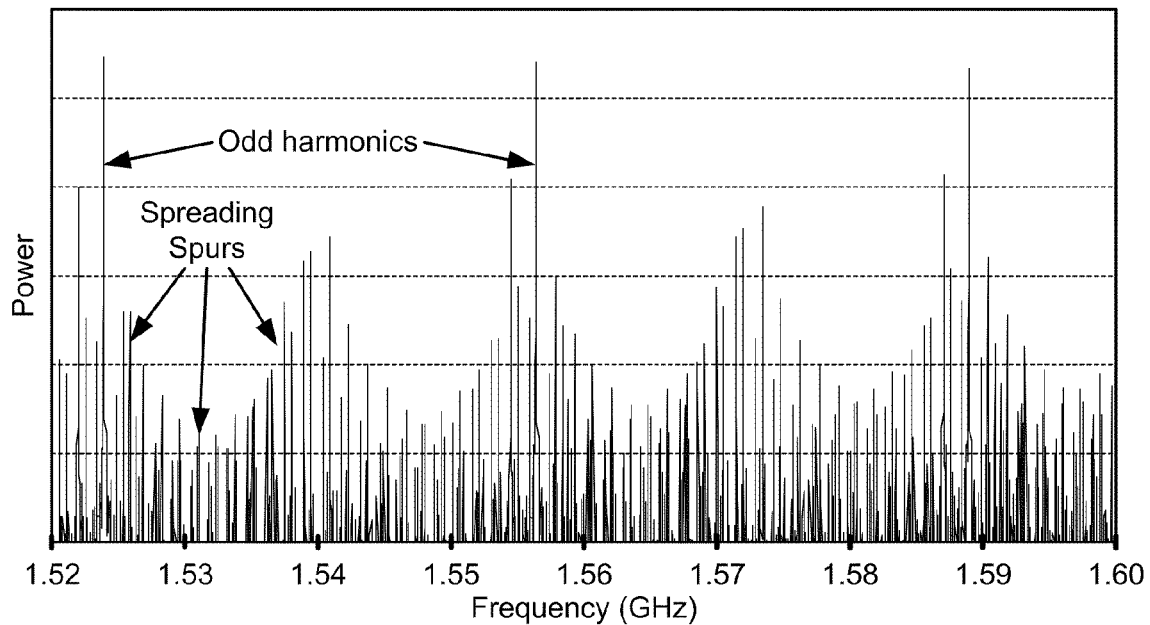
FIGS. 8A and 8B show spectral plots of the first and second clock signals.

FIG. 8A shows an exemplary spectral plot of the clock signal generated by fractional-N frequency synthesizer 160 in FIG. 1. The clock signal includes odd harmonics of the clock frequency $f_{out}$. The clock signal further includes undesired spreading spurs due to abrupt frequency jumps in the clock signal, which may result from the use of a fractional divider ratio by frequency synthesizer 160. The switching between divider ratios L and M may be periodic and may generate periodic frequency jumps in the clock signal. The clock signal may then include spreading spurs between odd harmonics in the frequency spectrum, as shown in FIG. 8A. Spreading spurs are undesired frequency components that appear across the entire frequency spectrum and between harmonics instead of only at certain frequencies. In general, spreading spurs may be present in any clock signal having abrupt frequency jumps in the time domain. The abrupt frequency jumps may result from the use of a fractional-N frequency synthesizer or may occur due to some other mechanism.

Referring back to FIG. 1, a clock signal with spreading spurs may be used to clock ADC 130 in the SoC receiver. The spreading spurs may then be present in various signals and circuits within ADC 130. The spreading spurs may couple from the ADC circuit area through the substrate to the input of LNA 122 (as shown in FIG. 1) and may act as additional noise to the input RF signal at the LNA input. The additional noise may degrade the performance of the receiver, especially if the receiver requires very good sensitivity or is prone to in-band spurs. One example of such a receiver is a Global Positioning System (GPS) receiver. In-band spurs are spurs that fall within an operating frequency range of the receiver. Since spreading spurs are present across the entire spectrum, some of the spreading spurs would naturally fall in-band.

Figure 2:
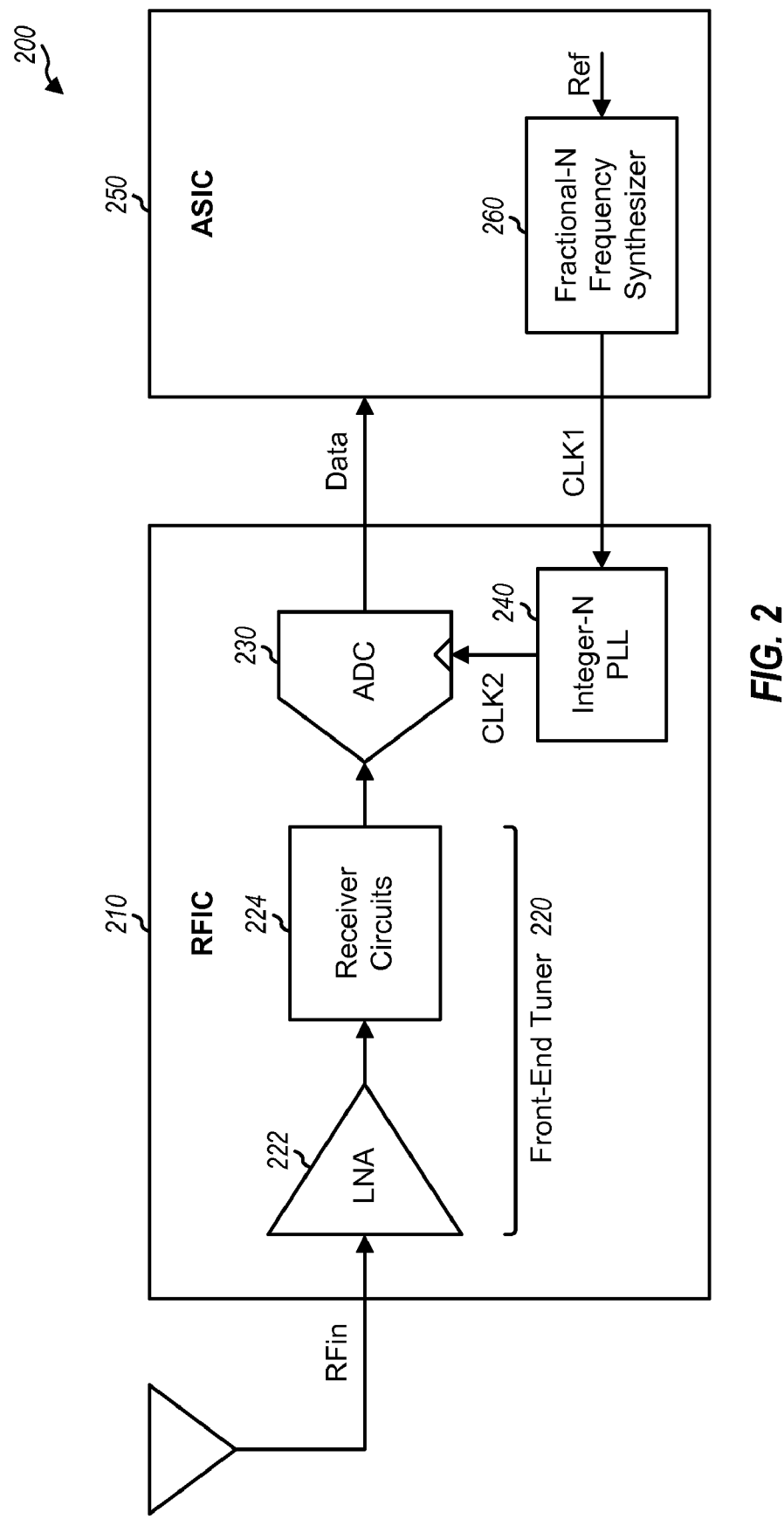
FIG. 2 shows a wireless communication device with an integer-N phase-locked loop (PLL) to mitigate the coupling of spurs.

FIG. 2 shows a block diagram of an exemplary design of a wireless communication device 200 with a clock clean-up PLL to combat undesired spreading spurs. Wireless device 200 includes an RFIC 210 and an ASIC 250. ASIC 250 may include processors, controllers, memories, etc., which are not shown in FIG. 2 for simplicity. ASIC 250 also includes a fractional-N frequency synthesizer 260 that can generate a first clock signal (CLK1) for RFIC 210.

In the exemplary design shown in FIG. 2, RFIC 210 includes a front-end tuner 220, an ADC 230, and an integer-N PLL 240 used as a clock clean-up PLL. Front-end tuner 220 includes an LNA 222 and receiver circuits 224 that may operate as described above for FIG. 1. Integer-N PLL 240 receives the first clock signal from fractional-N frequency synthesizer 260 in ASIC 250 and generates a second clock signal (CLK2) for ADC 230. In general, an integer-N PLL is a circuit block that receives an input signal at a first frequency and generates an output signal at a second frequency, with the first frequency being related to the second frequency by an integer ratio. The first clock signal may include undesired spreading spurs, and the second clock signal may include less spurs. ADC 230 digitizes an analog baseband signal from receiver circuits 224 with the second clock signal from PLL 250 and provides digital samples to ASIC 250. ADC 230 may be a sigma-delta (ΣΔ) ADC, a flash ADC, a successive approximation ADC, or some other type of ADC.

Figure 3:
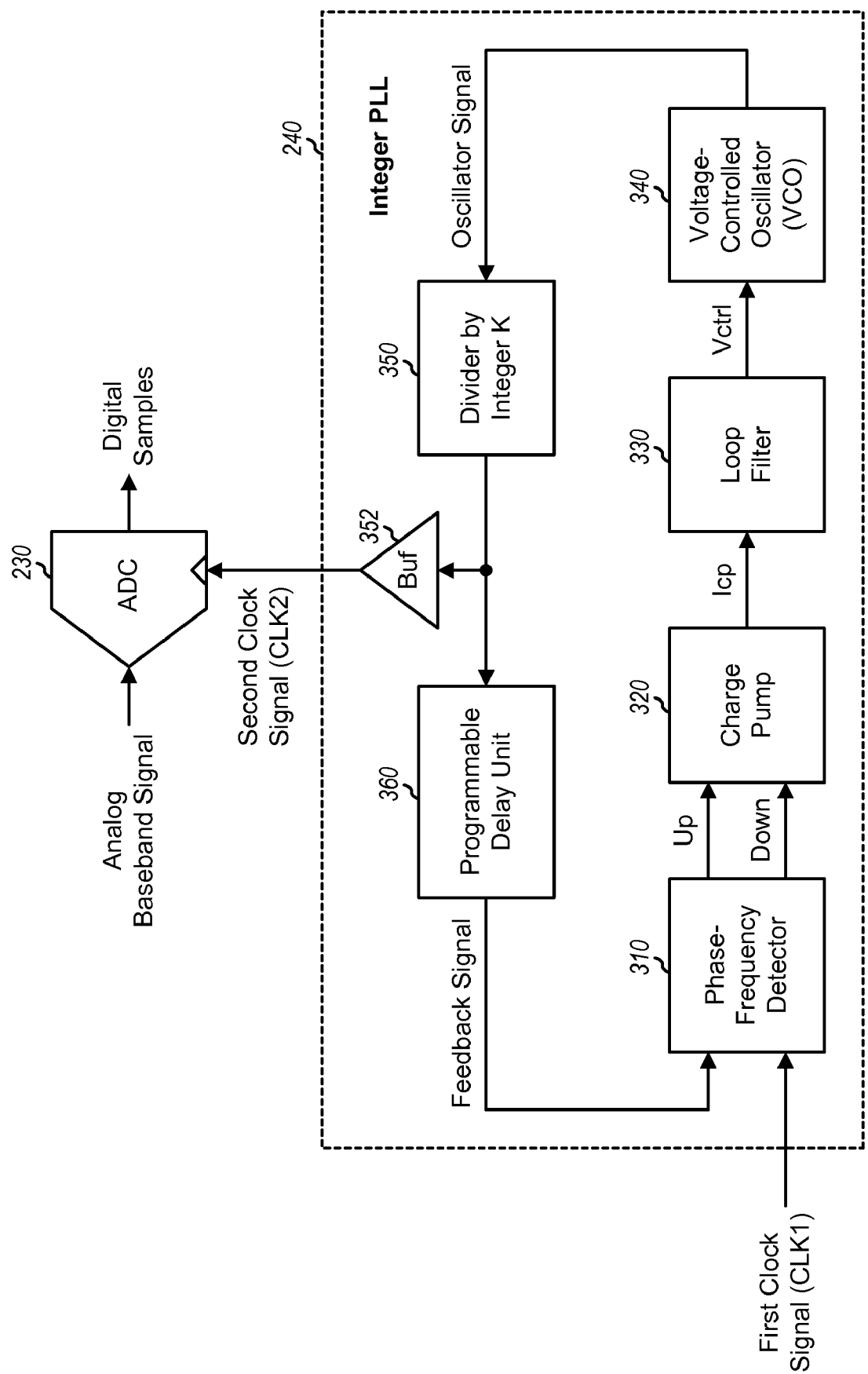
FIG. 3 shows a block diagram of the integer-N PLL.

FIG. 3 shows a block diagram of an exemplary design of integer-N PLL 240 within RFIC 210 in FIG. 2. Within PLL 240, a phase-frequency detector 310 receives the first clock signal from ASIC 250 and a feedback signal from a programmable delay unit 360, compares the phases of the two signals, and provides Up and Down signals indicative of the phase error/difference between the first clock signal and the feedback signal. The Up and Down signals are also commonly referred to as early and late signals, advance and retard signals, etc. A charge pump 320 receives the Up and Down signals and generates a current signal (Icp) that is indicative of the detected phase error. A loop filter 330 filters the current signal from charge pump 320 and generates a control signal (Vctrl) for a VCO 340. Loop filter 330 adjusts the control signal such that the frequency of the feedback signal is locked to the frequency of the first clock signal.

VCO 340 generates an oscillator signal having a frequency that is determined by the control signal from loop filter 330. A divider 350 divides the oscillator signal in frequency by an integer divider factor of K (e.g., by 2, 3, 4, etc.) and provides a divider output signal. A buffer 352 buffers the divider output signal and provides the second clock signal to ADC 230. Programmable delay unit 360 delays the divider output signal by a programmable delay and provides the delayed divider output signal as the feedback signal to phase-frequency detector 310. The delay of unit 360 may be adjusted so that the second clock signal has the desired phase, e.g., is time aligned with the first clock signal. Programmable delay unit 360 may also be omitted, and the divider output signal may be provided directly as the feedback signal.

Loop filter 330 has a frequency response that may be selected to obtain the desired closed-loop bandwidth for PLL 240. The closed-loop bandwidth of PLL 240 may be designed to be low in order to heavily attenuate the abrupt frequency jumps in the first clock signal and to suppress spreading spurs within the operating frequency range of LNA 222. In general, progressively smaller closed-loop bandwidth for PLL 240 may provide progressively more attenuation of the abrupt frequency jumps in the first clock signal and hence progressively less spreading spurs. However, a smaller closed-loop bandwidth may also result in a longer settling time for PLL 240, which may be undesirable. In one exemplary design, the closed-loop bandwidth of PLL 240 may be selected to be lower than (e.g., by a factor of at least two) or much lower than (e.g., about ⅒-th) the closed-loop bandwidth of fractional-N frequency synthesizer 260.

Figure 7B:
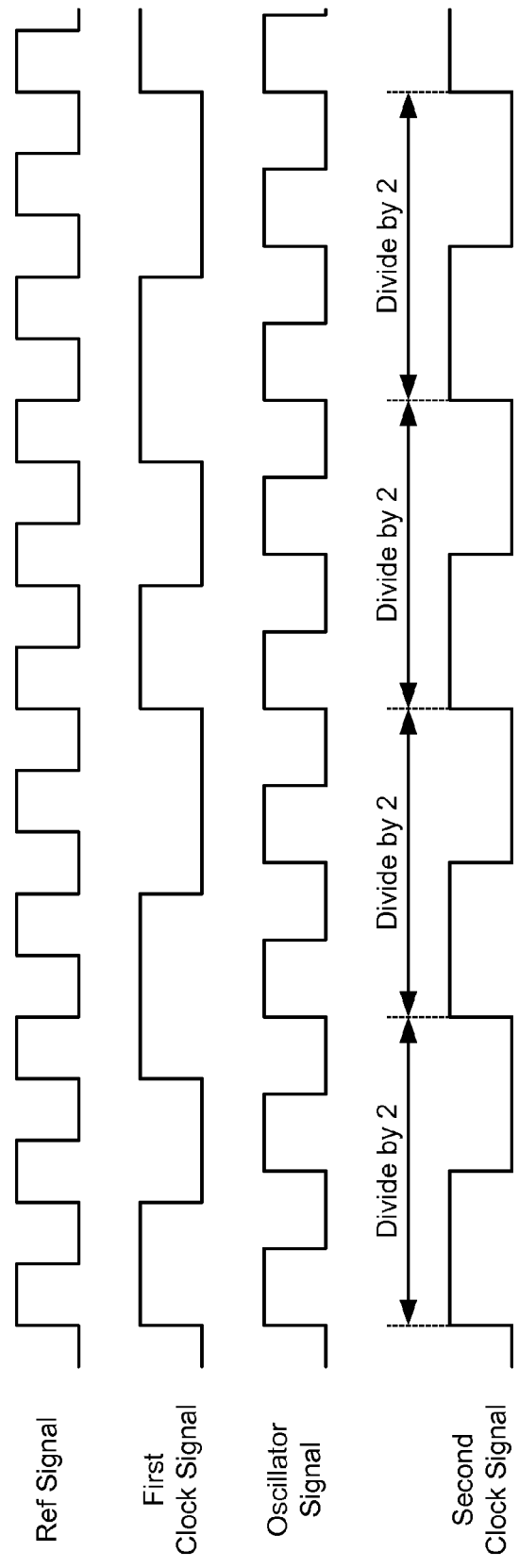

FIG. 7B shows an exemplary timing diagram of the clock signals generated by fractional-N frequency synthesizer 260 and integer-N PLL 240 in FIG. 2. In the example shown in FIG. 7B, L=2, M=3, N=2.5, and the first clock signal from frequency synthesizer 260 includes alternating short cycles and long cycles, as described above for FIG. 7A. In this example, the oscillator signal from VCO 340 has a frequency that is twice the desired frequency $f_{out}$ and is divided in frequency by a factor of two to obtain the second clock signal at the desired frequency.

In the example shown in FIG. 7B, the first clock signal has abrupt frequency jumps due to division by a non-integer divider ratio. The second clock signal does not have abrupt frequency jumps due to division by an integer divider ratio, which is two in this example. The instantaneous frequency of the first clock signal may be different from the instantaneous frequency of the second clock signal. However, the average frequency of the first clock signal is equal to the average frequency of the second clock signal.

Figure 8B:
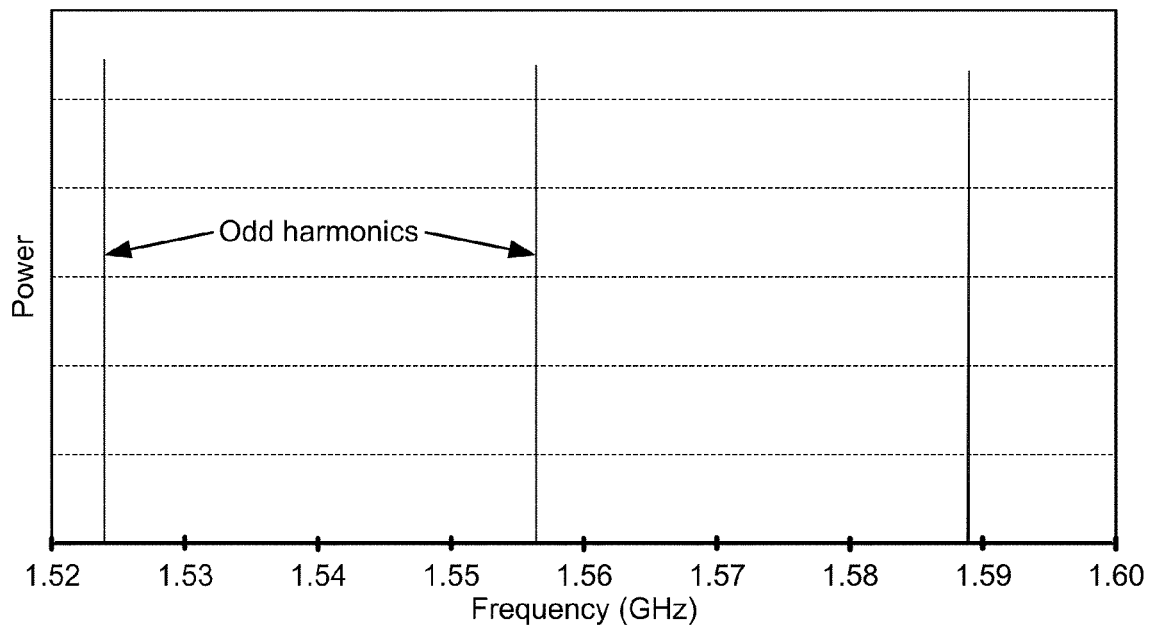

FIG. 8B shows an exemplary spectral plot of the second clock signal generated by integer-N PLL 240 in FIG. 2. The second clock signal includes odd harmonics of the clock frequency $f_{out}$ but does not include undesired spreading spurs.

Integer-N PLL 240 can attenuate abrupt frequency jumps in the first clock signal, which are the root of the undesired spreading spurs. Integer-N PLL 240 can thus suppress the spreading spurs in the first clock signal from coupling through the substrate and degrading the performance of LNA 222. Integer-N PLL 240 can provide a relatively clean second clock signal having no abrupt frequency jumps by dividing the oscillator signal from VCO 340 by an integer divider ratio. In general, the frequency $f_2$ of the second clock signal may be equal to the frequency $f_1$ of the first clock signal or may be an integer multiple of $f_1$ or an integer divisor of $f_1$.

Figure 4:
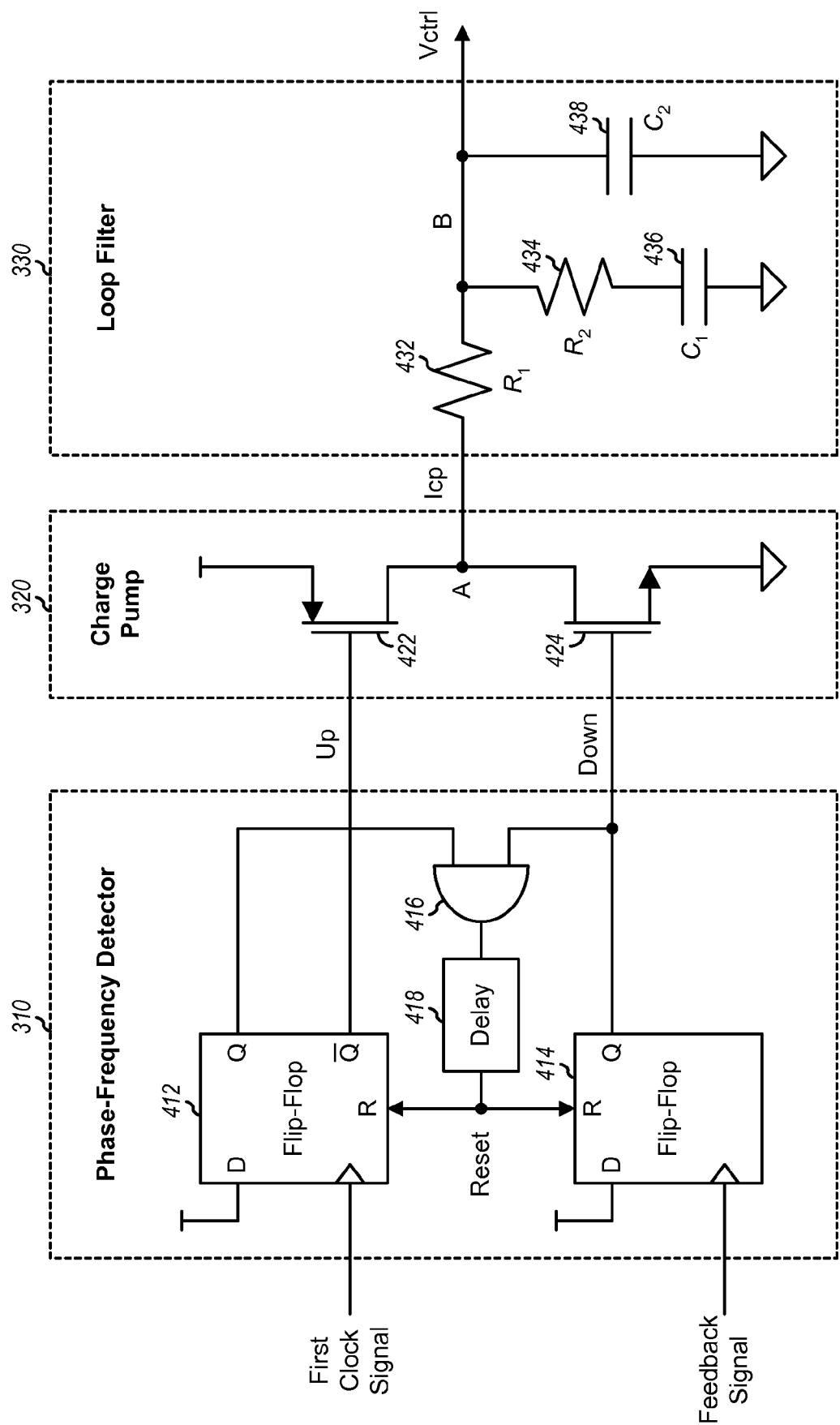
FIG. 4 shows a schematic diagram of a phase-frequency detector, a charge pump, and a loop filter within the integer-N PLL.

FIG. 4 shows a schematic diagram of an exemplary design of phase-frequency detector 310, charge pump 320, and loop filter 330 within integer-N PLL 240 in FIG. 3. Within phase frequency detector 310, the first clock signal and the feedback signal are provided to the clock inputs of D flip-flops 412 and 414, respectively. The data (D) inputs of flip-flops 412 and 414 are coupled to a power supply and receive logic high. The data (Q) output of flip-flop 412 is indicative of the first clock signal being early with respect to the feedback signal. The Q output of flip-flop 414 is indicative of the first clock signal being late with respect to the feedback signal. An AND gate 416 receives the Q outputs of flip-flops 412 and 414 and performs a logical AND on the two signals. A delay unit 418 delays the output of AND gate 416 by a small amount and provides a reset signal to the reset (R) inputs of flip-flops 412 and 414. The inverted data ($\overline{Q}$) output of flip-flop 412 provides the Up signal, and the Q output of flip-flop 414 provides the Down signal.

Within charge pump 320, a P-channel metal oxide semiconductor (PMOS) transistor 422 and an N-channel MOS (NMOS) transistor 424 are coupled in series and between the power supply and circuit ground. PMOS transistor 422 has its source coupled to the power supply, its gate receiving the Up signal from flip-flop 412, and its drain coupled to node A. NMOS transistor 424 has its drain coupled to node A, its gate receiving the Down signal from flip-flop 414, and its source coupled to circuit ground. PMOS transistor 422 provides a pull-up current when enabled by the Up signal, and NMOS transistor 424 provides a pull-down current when enabled by the Down signal.

The short delay by unit 418 is used to combat a dead zone in charge pump 320. PMOS transistor 422 and NMOS transistor 424 need some amount of time to turn on and off. This transition time is referred to as the dead zone since, during the transition time, phase information in the Up and Down signals may be lost. The short delay combats the dead zone.

Within loop filter 330, a resistor 432 is coupled between node A and node B. A resistor 434 and a capacitor 436 are coupled in series and between node B and circuit ground. A capacitor 438 is coupled between node B and circuit ground. A first-order loop may be implemented with only resistor 432 and capacitor 438. A second-order loop may be implemented with only resistors 432 and 434 and capacitor 436. A second-order loop with a high frequency pole for extra attenuation may be implemented with resistors 432 and 434 and capacitors 436 and 438. Capacitor 438 may reduce ripple on the control voltage from loop filter 330 and may also stabilize the PLL loop. The values of resistors 432 and 434 and capacitors 436 and 438 may be selected to obtain the desired closed-loop bandwidth for integer-N PLL 240.

Figure 5:
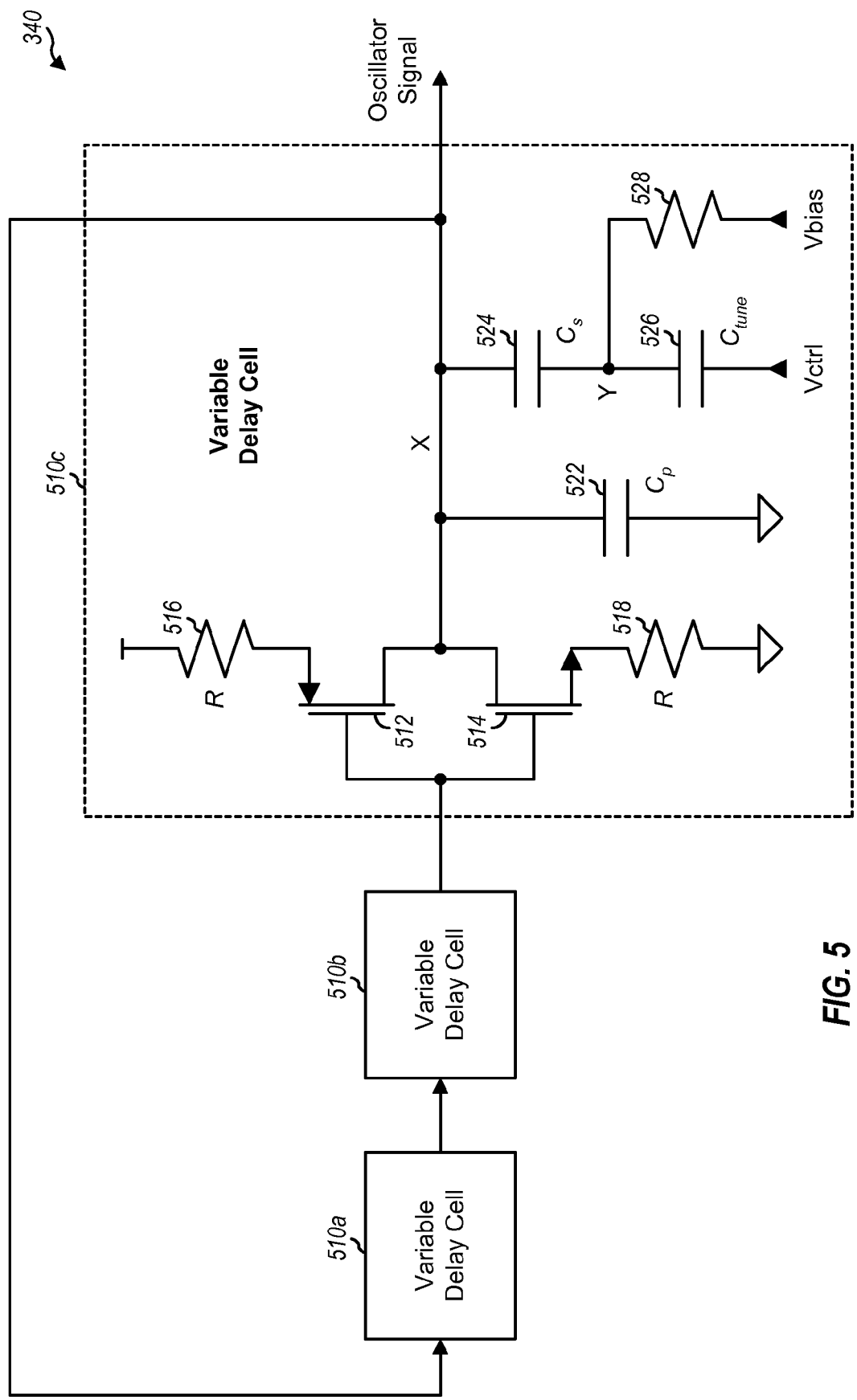
FIG. 5 shows a schematic diagram of a voltage-controlled oscillator (VCO).

FIG. 5 shows a schematic diagram of an exemplary design of VCO 340 in FIG. 3. In this exemplary design, VCO 340 is implemented with a ring oscillator and includes three variable delay cells 510a, 510b and 510c coupled in a loop. Delay cell 510a has its output coupled to the input of delay cell 510b, which has its output coupled to the input of delay cell 510c, which further has its output coupled to the input of delay cell 510a. The three delay cells 510a, 510b and 510c may be implemented in similar manner, and only delay cell 510c is described below.

Within delay cell 510c, a PMOS transistor 512 and an NMOS transistor 514 are coupled as an inverter. MOS transistors 512 and 514 have their gates coupled together and to the delay cell input and their drains coupled together and to the delay cell output, which is node X. A resistor 516 is coupled between the source of PMOS transistor 512 and the power supply. A resistor 518 is coupled between the source of NMOS transistor 514 and circuit ground. A capacitor 522 is coupled between node X and circuit ground. A capacitor 524 is coupled between node X and node Y. A capacitor 526 has one end coupled to node Y and the other end receiving the Vctrl control signal from loop filter 330. A resistor 528 has one end coupled to node Y and the other end receiving a bias voltage (Vbias).

The delay of delay cell 510c is determined by the value R of resistors 516 and 518 and the value of capacitors 522, 524 and 526. The value $C_{tune}$ of capacitor 526 may be varied by changing the voltage on the Vctrl control signal. Capacitor 524 may be an AC coupling capacitor and may have a value that is much larger than $C_{tune}$. The value $C_p$ of capacitor 522 and the nominal value of capacitor 526 may be selected to obtain the desired nominal center frequency and the desired tuning range for VCO 340. The desired tuning range may be dependent on (i) the range of operating frequencies for the first clock signal and (ii) variations in frequency due to variations in IC process, temperature, power supply, etc. The same Vbias control voltage may be applied to resistor 528 in all three delay cells 510a, 510b and 510c. Similarly, the same Vctrl signal may be applied to capacitor 526 in all three delay cells 510a, 510b and 510c. Resistors 516 and 518 may have fixed values of R, as shown in FIG. 5. Alternatively, resistors 516 and 518 may have configurable values, which may be selected to obtain the desired nominal frequency for VCO 340.

FIG. 5 shows an exemplary design of VCO 340, which may be simple to implement and may further occupy a small area and consume little current. VCO 340 may also be implemented with other designs.

Figure 6:
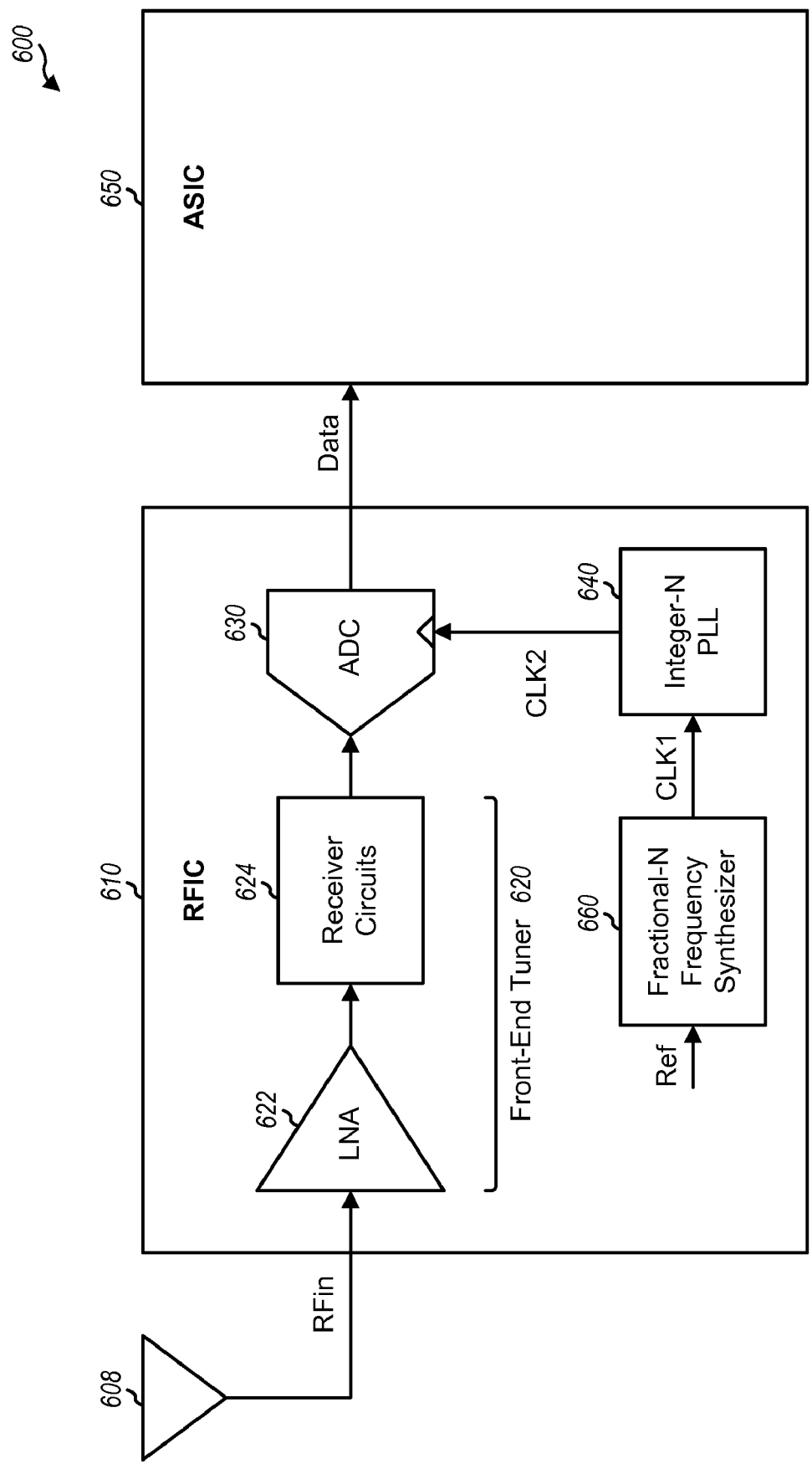
FIG. 6 shows another wireless communication device with an integer-N PLL to mitigate the coupling of spurs.

FIG. 6 shows a block diagram of an exemplary design of a wireless communication device 600 with a clock clean-up PLL to combat undesired spreading spurs. Wireless device 600 includes an RFIC 610 and an ASIC 650. ASIC 650 may include processors, controllers, memories, etc., which are not shown in FIG. 6 for simplicity.

In the exemplary design shown in FIG. 6, RFIC 610 includes a front-end tuner 620, an ADC 630, an integer-N PLL 640 used as a clock clean-up PLL, and a fractional-N frequency synthesizer 660. Front-end tuner 620 includes an LNA 622 and receiver circuits 624 that may operate as described above for FIG. 1. Frequency synthesizer 660 may generate a first clock signal having abrupt frequency jumps due to the use of a non-integer divider ratio. PLL 640 may receive the first clock signal from frequency synthesizer 660 and generate a second clock signal for ADC 630. The second clock signal may have no abrupt frequency jumps due to the use of an integer divider ratio and may thus include less spurs than the first clock signal. ADC 630 digitizes an analog baseband signal from receiver circuits 624 with the second clock signal from PLL 640 and provides digital samples to ASIC 650 for processing.

As shown in FIGS. 2 and 6, an integer-N PLL may be used as a clean-up PLL for the ADC clock signal in order to greatly reduce high frequency spurs and thus reduce in-band spurs observed at the input of an LNA. The integer-N PLL may be implemented with a simple digital PLL design (e.g., as shown in FIGS. 3, 4 and 5) and may then occupy a small area and consume little additional current. The integer-N PLL may receive a first clock signal having spreading spurs due to abrupt frequency jumps and may clean up the spurs with a low closed-loop bandwidth. The integer-N PLL may provide a clean second clock signal to an ADC.

In one exemplary design, an integrated circuit may comprise a PLL and an ADC, e.g., as shown in FIG. 2. The PLL may receive a first clock signal (CLK1) having spurs due to abrupt frequency jumps and may provide a second clock signal (CLK2) having reduced spurs, e.g., due to no abrupt frequency jumps. The first clock signal may be generated by a fractional-N frequency synthesizer, which may be external to the integrated circuit (e.g., as shown in FIG. 2) or internal to the integrated circuit (e.g., as shown in FIG. 6). In either case, the abrupt frequency jumps in the first clock signal may result from the use of a fractional divider ratio in the frequency synthesizer, e.g., as illustrated in FIG. 7A. The second clock signal may be generated by the PLL based on an integer divider ratio and may include no abrupt frequency jumps due to the use of the integer divider ratio, e.g., as illustrated in FIG. 7B.

The ADC may digitize an analog baseband signal based on the second clock signal and provide digital samples. The integrated circuit may further comprise an LNA and receiver circuits. The LNA may receive and amplify an input RF signal and provide an amplified RF signal. The receiver circuits may process the amplified RF signal and provide the analog baseband signal to the ADC. The LNA may observe less spurs coupled via the substrate of the integrated circuit due to the use of the PLL to clean up the first clock signal.

In one exemplary design, the PLL may comprise a phase-frequency detector, a charge pump, a loop filter, a VCO, and a divider, e.g., as shown in FIG. 3. The phase-frequency detector may receive the first clock signal and a feedback signal and provide first and second detector output signals (e.g., Up and Down signals) indicative of the phase error between the first clock signal and the feedback signal. The charge pump may receive the first and second detector output signals and provide a current signal. The loop filter may filter the current signal and provide a control signal (e.g., Vctrl signal). The VCO may receive the control signal and provide an oscillator signal having a frequency determined by the control signal. The divider may divide the oscillator signal in frequency by an integer divider ratio and provide a divider output signal. The PLL may further comprise a programmable delay unit to delay the divider output signal by a programmable delay and provide the feedback signal. The programmable delay may be selected to adjust the phase of the second clock signal relative to the phase of the first clock signal.

In one exemplary design, the VCO may comprise multiple variable delay cells coupled in a loop, e.g., as shown in FIG. 5. Each variable delay cell may have a variable delay determined by the control signal from the loop filter. The VCO and the PLL may also be implemented with other designs.

In one exemplary design, the PLL may have a closed-loop bandwidth that may be lower than a closed-loop bandwidth of the fractional-N frequency synthesizer by a factor of at least two (e.g., by a factor of 10). More attenuation of undesired spurs in the first clock signal may be achieved with lower closed-loop bandwidth for the PLL. In one exemplary design, the first and second clock signals may have the same frequency, e.g., as shown in FIG. 7B. In another exemplary design, the first clock signal may have a first frequency that may be related to a second frequency of the second clock signal by an integer ratio.

In one exemplary design, an apparatus may comprise first and second integrated circuits. The first integrated circuit (e.g., ASIC 250 in FIG. 2) may comprise a fractional-N frequency synthesizer that may provide a first clock signal. The second integrated circuit (e.g., RFIC 210 in FIG. 2) may be coupled to the first integrated circuit and may comprise a PLL and an ADC. The PLL may receive the first clock signal and provide a second clock signal. The ADC may digitize an analog baseband signal based on the second clock signal and provide digital samples. The second integrated circuit may further comprise an LNA and receiver circuits. The LNA may receive and amplify an input RF signal and provide an amplified RF signal. The receiver circuits may process the amplified RF signal and provide the analog baseband signal to the ADC. The LNA may observe less spurs coupled via the substrate of the second integrated circuit due to the use of the PLL to clean up the first clock signal.

Figure 9:
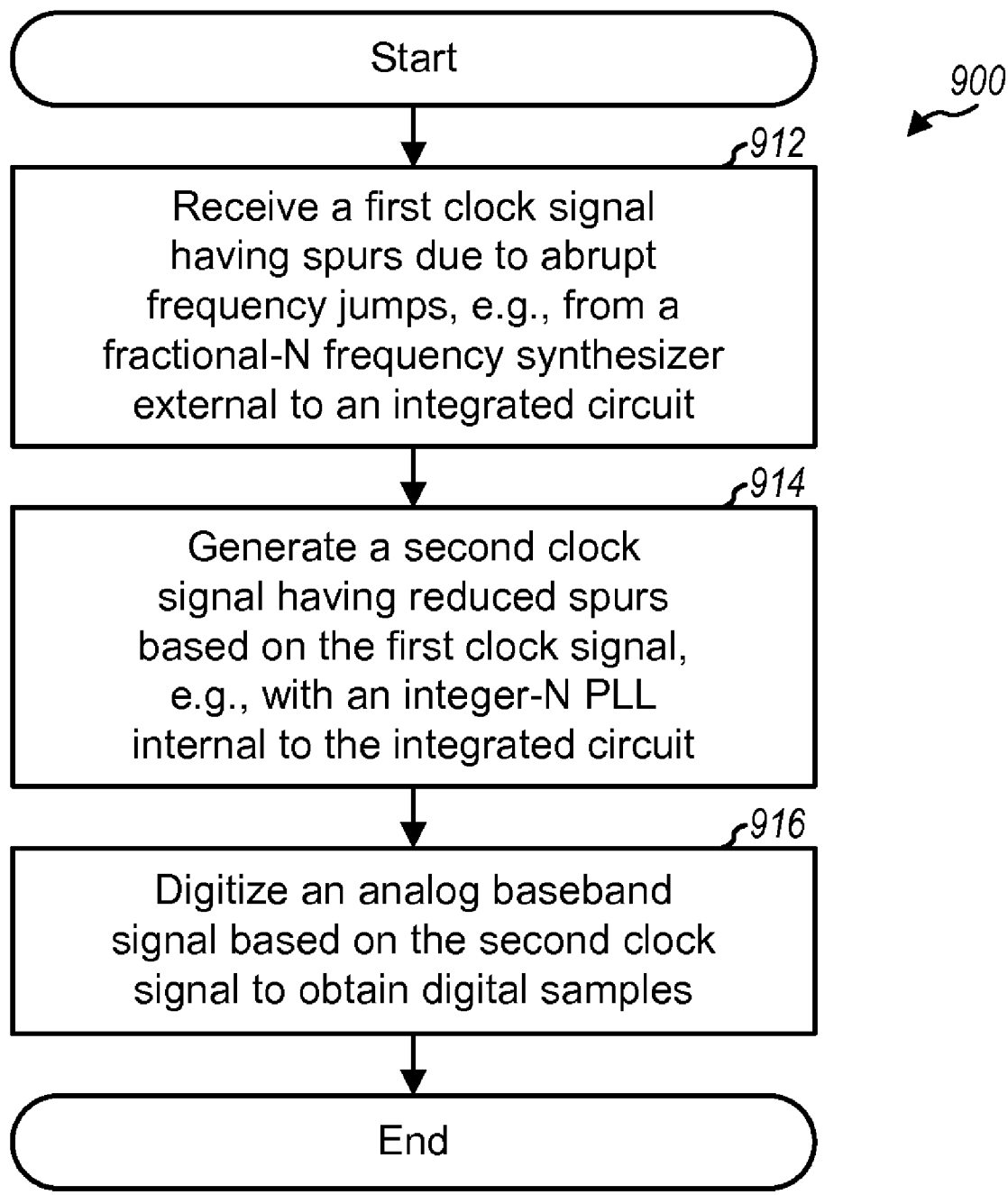
FIG. 9 shows a process for operating a receiver.

FIG. 9 shows an exemplary design of a process 900 for operating a receiver implemented on an integrated circuit. A first clock signal having spurs due to abrupt frequency jumps may be received, e.g., from a fractional-N frequency synthesizer implemented on the same integrated circuit or another integrated circuit (block 912). The first clock signal may be generated based on a reference signal and a non-integer divider ratio between the frequency of the first clock signal and the frequency of the reference signal. A second clock signal having reduced spurs may be generated based on the first clock signal, e.g., with an integer-N PLL implemented on the integrated circuit (block 914). The PLL may be operated with a closed-loop bandwidth that may be lower than a closed-loop bandwidth of the fractional-N frequency synthesizer, e.g., by a factor of at least two, in order to heavily attenuate the spurs in the first clock signal. An analog baseband signal may be digitized based on the second clock signal to obtain digital samples (block 916).

The clock clean-up PLL described herein may be implemented on an IC, an analog IC, an RFIC, a mixed-signal IC, an ASIC, a printed circuit board (PCB), an electronics device, etc. The clock clean-up PLL may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the clock clean-up PLL described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An integrated circuit comprising:
    a phase-locked loop (PLL) to receive a first clock signal having spurs due to abrupt frequency jumps and provide a second clock signal having reduced spurs; and
    an analog-to-digital converter (ADC) to digitize an analog baseband signal based on the second clock signal and provide digital samples.

2. The integrated circuit of claim 1, further comprising:
    a fractional-N frequency synthesizer to receive a reference signal and provide the first clock signal having abrupt frequency jumps due to use of a fractional divider ratio in the frequency synthesizer.

3. The integrated circuit of claim 1, the second clock signal being generated by the PLL based on an integer divider ratio.

4. The integrated circuit of claim 1, further comprising:
    a low noise amplifier (LNA) to receive and amplify an input radio frequency (RF) signal and provide an amplified RF signal; and
    receiver circuits to process the amplified RF signal and provide the analog baseband signal to the ADC.

5. The integrated circuit of claim 1, the PLL comprising a voltage-controlled oscillator (VCO) comprising multiple variable delay cells coupled in a loop, each variable delay cell having a variable delay determined by a control signal from the PLL.

6. The integrated circuit of claim 1, the first and second clock signals having same frequency.

7. The integrated circuit of claim 1, the first clock signal having a first frequency related to a second frequency of the second clock signal by an integer ratio.

8. The integrated circuit of claim 1, the first clock signal being generated by a fractional-N frequency synthesizer external to the integrated circuit, and the abrupt frequency jumps in the first clock signal resulting from use of a fractional divider ratio in the frequency synthesizer.

9. The integrated circuit of claim 8, the PLL having a closed-loop bandwidth that is lower than a closed-loop bandwidth of the fractional-N frequency synthesizer by a factor of at least two.

10. The integrated circuit of claim 1, the PLL comprising:
    a phase-frequency detector to receive the first clock signal and a feedback signal and provide first and second detector output signals indicative of phase error between the first clock signal and the feedback signal,
    a charge pump to receive the first and second detector output signals and provide a current signal,
    a loop filter to filter the current signal and provide a control signal, and
    a voltage-controlled oscillator (VCO) to receive the control signal and provide an oscillator signal having a frequency determined by the control signal.

11. The integrated circuit of claim 10, the PLL further comprising
    a divider to divide the oscillator signal in frequency by an integer divider ratio and provide a divider output signal used to derive the second clock signal.

12. The integrated circuit of claim 11, the PLL further comprising
    a programmable delay unit to receive and delay the divider output signal by a programmable delay and provide the feedback signal.

13. An apparatus comprising:
    a first integrated circuit comprising a fractional-N frequency synthesizer providing a first clock signal; and
    a second integrated circuit coupled to the first integrated circuit and comprising:
        a phase-locked loop (PLL) to receive the first clock signal and provide a second clock signal, and
        an analog-to-digital converter (ADC) to digitize an analog baseband signal based on the second clock signal and provide digital samples.

14. The apparatus of claim 13, the first clock signal having spurs due to abrupt frequency jumps resulting from use of a fractional divider ratio in the frequency synthesizer, and the second clock signal having reduced spurs due to use of an integer divider ratio in the PLL.

15. The apparatus of claim 13, the second integrated circuit further comprising:
    a low noise amplifier (LNA) to receive and amplify an input radio frequency (RF) signal and provide an amplified RF signal, and
    receiver circuits to process the amplified RF signal and provide the analog baseband signal to the ADC.

16. The apparatus of claim 13, the PLL having a closed-loop bandwidth that is lower than a closed-loop bandwidth of the fractional-N frequency synthesizer by a factor of at least two.

17. An apparatus comprising:
    means for receiving a first clock signal having spurs due to abrupt frequency jumps;
    means for generating a second clock signal having reduced spurs based on the first clock signal; and
    means for digitizing an analog baseband signal based on the second clock signal to obtain digital samples.

18. The apparatus of claim 17, further comprising:
means for generating the first clock signal based on a reference signal and a non-integer divider ratio between a first frequency of the first clock signal and a second frequency of the reference signal.

19. The apparatus of claim 17, the means for receiving the first clock signal comprising means for receiving the first clock signal from a fractional-N frequency synthesizer on a first integrated circuit, and the means for generating the second clock signal comprising means for generating the second clock signal with a phase-locked loop (PLL) on a second integrated circuit.

20. The apparatus of claim 19, further comprising:
means for operating the PLL with a closed-loop bandwidth that is lower than a closed-loop bandwidth of the fractional-N frequency synthesizer by a factor of at least two.

21. A non-transitory computer readable medium storing computer program product, comprising:
code for causing at least one computer to receive a first clock signal having spurs due to abrupt frequency jumps,
code for causing the at least one computer to generate a second clock signal having reduced spurs based on the first clock signal, and
code for causing the at least one computer to provide the second clock signal to an analog-to-digital converter (ADC) for digitizing an analog baseband signal to obtain digital samples.

22. A method comprising:
receiving a first clock signal having spurs due to abrupt frequency jumps;
generating a second clock signal having reduced spurs based on the first clock signal; and
digitizing an analog baseband signal based on the second clock signal to obtain digital samples.

23. The method of claim 22, further comprising:
generating the first clock signal based on a reference signal and a non-integer divider ratio between a first frequency of the first clock signal and a second frequency of the reference signal.

24. The method of claim 22, the receiving the first clock signal comprising receiving the first clock signal from a fractional-N frequency synthesizer on a first integrated circuit, and the generating the second clock signal comprising generating the second clock signal with a phase-locked loop (PLL) on a second integrated circuit.

25. The method of claim 24, further comprising:
operating the PLL with a closed-loop bandwidth that is lower than a closed-loop bandwidth of the fractional-N frequency synthesizer by a factor of at least two.

* * * * *